United States Patent
Bauer et al.

(10) Patent No.: US 7,420,262 B2
(45) Date of Patent: Sep. 2, 2008

(54) ELECTRONIC COMPONENT AND SEMICONDUCTOR WAFER, AND METHOD FOR PRODUCING THE SAME

(75) Inventors: Michael Bauer, Regensburg (DE); Peter Strobel, Regensburg (DE); Gerald Ofner, Bad Abbach (DE); Edward Fürgut, Dasing (DE); Simon Jerebic, Regensburg (DE); Thomas Bemmerl, Schwandorf (DE); Markus Fink, Zell (DE); Hermann Vilsmeier, Regensburg (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/789,033

(22) Filed: Feb. 27, 2004

(65) Prior Publication Data
US 2004/0207049 A1 Oct. 21, 2004

(30) Foreign Application Priority Data
Feb. 27, 2003 (DE) ................................. 103 08 855

(51) Int. Cl.
 *H01L 21/66* (2006.01)
(52) U.S. Cl. .................. 257/620; 257/501; 257/513; 257/520; 257/621; 257/E23.062; 257/E25.013
(58) Field of Classification Search ......... 257/620–621, 257/501, 513, 520, 522; 438/113, 458, 462
See application file for complete search history.

(56) References Cited

U.S. PATENT DOCUMENTS

| | | | |
|---|---|---|---|
| 3,887,783 A * | 6/1975 | Comette | 219/85.16 |
| 4,930,216 A | 6/1990 | Nelson | |
| 4,984,358 A | 1/1991 | Nelson | |
| 5,031,072 A * | 7/1991 | Malhi et al. | 361/706 |
| 5,126,286 A | 6/1992 | Chance | |
| 6,213,347 B1 * | 4/2001 | Thomas | 222/52 |
| 6,235,554 B1 * | 5/2001 | Akram et al. | 438/109 |
| 6,406,934 B1 * | 6/2002 | Glenn et al. | 438/106 |
| 6,528,870 B2 * | 3/2003 | Fukatsu et al. | 257/685 |
| 7,071,028 B2 * | 7/2006 | Koike et al. | 438/107 |
| 2002/0094607 A1 * | 7/2002 | Gebauer et al. | 438/114 |
| 2002/0158345 A1 * | 10/2002 | Hedler et al. | 257/786 |
| 2004/0124523 A1 * | 7/2004 | Poo et al. | 257/698 |
| 2004/0157410 A1 * | 8/2004 | Yamaguchi | 438/460 |
| 2004/0169271 A1 * | 9/2004 | Igarashi et al. | 257/709 |
| 2005/0130345 A1 * | 6/2005 | Jeung et al. | 438/106 |

FOREIGN PATENT DOCUMENTS

| | | | |
|---|---|---|---|
| DE | 10101875 | * | 8/2002 |
| DE | 10216823 | * | 11/2003 |
| JP | 2002-299372 | * | 10/2002 |
| WO | WO 03/012868 | * | 2/2003 |

* cited by examiner

*Primary Examiner*—Ahmed Sefer
(74) *Attorney, Agent, or Firm*—Dicke, Billig, Czaja PLLC

(57) ABSTRACT

The invention relates to an electronic component and a semiconductor wafer, and a method for producing them. The semiconductor wafer has strip-type separating regions. The separating regions are provided with through contacts in the direction of the rear side of the semiconductor wafer. The semiconductor chip separated from such a semiconductor wafer constitutes an electronic component with external contacts in the form of edge contacts. Such an electronic component of semiconductor chip size can be used in diverse ways.

9 Claims, 7 Drawing Sheets

ELECTRONIC COMPONENT AND SEMICONDUCTOR WAFER, AND METHOD FOR PRODUCING THE SAME

CROSS-REFERENCE TO RELATED APPLICATIONS

This Utility Patent Application claims priority to German Patent Application No. DE 103 08 855.5, filed on Feb. 27, 2003, which is incorporated herein by reference.

BACKGROUND

The invention relates to an electronic component and a semiconductor wafer and a method for producing the same. In particular, the invention relates to a semiconductor wafer which can be separated into individual electronic components.

The size of semiconductor chips is continually increasing despite the circuit packages that are becoming denser per semiconductor chip, so that electronic components of semiconductor chip size have been provided in the meantime. Access to the integrated circuits of the semiconductor chip via external contacts remains a problem, however.

The document DE 101 20 408 A1 discloses arranging external contacts on a top side and on a rear side of the semiconductor chip, which are connected to one another via conductor tracks in the edge region of the semiconductor chip. One disadvantage of this solution is a limited flexibility when fitting such an electronic component with external contacts on the top side and the rear side onto a superordinate circuit carrier. The possibilities for using such an electronic component of semiconductor chip size are consequently limited.

A useful addition to the art would be to increase the use variants of electronic components of semiconductor chip size and to provide semiconductor wafers from which such electronic components can be separated.

SUMMARY

One embodiment of the present invention provides a semiconductor wafer for electronic components, which has integrated circuits for semiconductor chips arranged in rows and columns on its wafer top side. Strip-type separating regions are kept free between the integrated circuits and remain free for sawing the semiconductor wafer into semiconductor chips. According to one embodiment of the invention, said separating regions have through contacts in the direction of the rear side of the semiconductor wafer. In this case, the clear width of the through contacts in the separating regions may be provided such that it is larger than the sawing track when separating the semiconductor wafer into individual semiconductor chips. The through contacts may be arranged in blind holes on the semiconductor wafer in the separating regions or else in passage holes reaching from the wafer top side as far as the wafer rear side.

Such a semiconductor wafer has the advantage that, when the semiconductor wafer is separated along the strip-type separating regions, semiconductor chips are produced which have edge contacts and can thus be used more diversely than conventional electronic components of semiconductor chip size. A semiconductor wafer structured in this way furthermore has the advantage that corresponding edge contacts can be realized simultaneously for many semiconductor chips while still at the wafer level, which enables considerable cost savings in the production of external contacts at an electronic component of semiconductor chip size.

Furthermore, the semiconductor wafer may have through contacts which are provided with perforations at regular intervals. Said perforations form a grid pattern for through contacts from the top side of the semiconductor wafer in the direction of the rear side of the semiconductor wafer. In order to introduce such perforations perpendicularly into the semiconductor wafer, a plasma etching method has proven worthwhile, which enables holes with a uniform cross section from the top side to the underside of the semiconductor wafer. Such a plasma etching process can be concluded at an arbitrary depth at any time, thereby producing blind holes which are likewise suitable for a formation of edge contacts. Identical structures can also be produced in the strip-type separating regions of the semiconductor wafer by means of a laser removal. By means of these techniques, the profile of the cross section of the perforation can be varied from round to polygonal.

The walls of the perforations may have a metal layer or an insulation layer with a metal layer applied thereto. An insulation layer below the metal layer is advantageous particularly when the semiconductor material is highly doped and thus itself is electrically conductive. With high-impedance semiconductor material, it is possible, in individual cases, to dispense with an insulation layer between metal layer and perforation walls.

The passage contacts may have fusible solder material, which is introduced into the passage contacts before the semiconductor wafer is actually divided into semiconductor chips. For this purpose, either the passage contact positions may be provided with solder balls, the solder material of which then flows in molten form into the through contacts, or a liquefied solder material may be pressed into the passage contacts on the semiconductor wafer.

After the separation of the semiconductor wafer, a semiconductor chip having an integrated circuit on a top side is present, having edge sides, of which at least one edge side has edge contacts. In this case, the edge contacts extend from the top side of the semiconductor chip in the direction of the rear side of the semiconductor chip. On the top side of the semiconductor chip, said edge contacts are connected to electrodes of the integrated circuit via conductor tracks. Depending on whether metalized blind holes or passage holes have been provided with the semiconductor wafer, the semiconductor chip has either continuous edge contacts reaching from the top side of the semiconductor chip to the underside of the semiconductor chip or only shortened edge contacts extending only over a part of the thickness of the semiconductor chip.

The semiconductor chip may have a perforation-like structure on its edge sides. In this case, an approximately semicylindrical cutout extending from the top side in the direction of the rear side may be formed as an edge contact by means of the separation operation. Since the sawing track leads centrally through the through contacts during the operation of separating the semiconductor wafer into individual semiconductor chips, the edge contacts form only an approximately semicylindrical contact. In this case, at least the walls of the cutouts are provided with an insulating layer and with a metal layer arranged thereon or only with a metal layer.

The semicylindrical cutouts in the edge region extend into the semiconductor chip material and may be filled by a solder material. When a semiconductor chip is placed on a circuit substrate, the said solder material in the cutouts obviates the additional application of solder material, thereby significantly simplifying the placement process.

Edge contacts may be extended on the top side to form a respective contact area and merge with a conductor track on the top side of the semiconductor chip. This advantageously produces a connection between the edge contacts and the electrodes of the integrated circuit on the top side of the semiconductor chip, which reliably and securely ensure an access to the integrated circuit of the semiconductor chip.

The semiconductor chip itself may already constitute an electronic component since it has external contacts in the form of the edge contacts and an access to the integrated circuit on the semiconductor chip is thus possible, as a result of which an electronic component of chip size is available.

Furthermore, it is possible to provide electronic components which have a semiconductor chip of this type and a circuit substrate on which the semiconductor chip is arranged. An electronic component of this type can be constructed with a wide variety of variations, so that the semiconductor chip can be arranged on the circuit substrate not only by its top side or its underside, but also by one of its edge sides. This has the advantage that, by way of example, a plurality of memory chips can be connected via their edge side contacts to a parallel data bus of address lines, in which case, with the exception of two external contacts of the semiconductor chips, all the external contacts on an edge side are connected to the parallel data bus. An electronic component of this type has a high storage density since top sides and rear sides of the semiconductor chips extend in angled fashion with respect to the top side of the circuit substrate. Furthermore, it is possible to intensively cool such an electronic component with memory chips, since neither the rear side nor the top side are covered by the circuit substrate and a surrounding cooling medium can thus dissipate the heat loss both from the top side and from the rear side.

However, the component may also have a circuit substrate for example in the form of a printed circuit board. Said printed circuit board has at least one conductor track structure, which may run on the top side, in the volume of the printed circuit board or on the underside. Contact pads enabling access to the conductor track structure only have to be provided on the top side of the circuit substrate, so that a semiconductor chip can be fixed on the top side by its edge contacts. In such an embodiment of the invention, the semiconductor chip may be arranged with its rear side on the top side of the circuit substrate and the edge contacts may be electrically connected via contact pads of the conductor track structure.

In the case of such an arrangement, it is advantageous to provide an insulating plastics composition with embedding of the edge sides of the semiconductor chip and the contact pads around the semiconductor chip on the circuit substrate. Said plastics composition may be a customary plastics housing composition or a dispensed plastics composition which is applied to the circuit substrate all around the semiconductor chip.

In a further variant of an electronic component, at least one semiconductor chip is arranged with an edge side on the circuit carrier substrate. In this case, the top side of the semiconductor chip and the rear side of the semiconductor chip may be oriented virtually perpendicularly to the top side of the circuit substrate. Such an angled orientation of the semiconductor chips on the circuit substrate has the advantage that, on the one hand, only edge contacts of a single edge are connected to the contact pads of the circuit substrate. However, it is possible to achieve a high packing density for memory components by means of an electronic component of this type, since the semiconductor chips can be arranged very closely next to one another on the circuit substrate.

A further possibility of a construction of an electronic component comprising the semiconductor chip with edge contacts consists in the fact that a plurality of semiconductor chips are stacked one on the other and are electrically connected via the edge contacts among one another and also with respect to external contacts of the electronic component. In this case, the number of semiconductor chips in the stack is practically unlimited and the density of the electronic component is optimized since one semiconductor chip can be stacked directly on the next semiconductor chip. In this case, it is possible to utilize all the edge contacts on all four edges of the semiconductor chips for a parallel connection, once again at least two connections remaining reserved for driving individual semiconductor chips in the stack.

A method for producing a semiconductor wafer for electronic components has the following method steps. As soon as the integrated circuits have been introduced on the semiconductor wafer in a manner arranged in rows and columns, the semiconductor wafer may be perforated along the three strip-type separating regions. After perforation has been effected, a metal layer may be applied to the walls of the perforations. During the later separation of the semiconductor wafer to electronic components of chip size, said metal layer may already serve as an edge contact or external contact.

Before the application of the metal layer into the perforations of the semiconductor wafer, an insulation layer may be applied to the walls of the perforations in order to increase the reliability of the electronic component, especially since, in the case of highly doped semiconductor chips, said semiconductor chips themselves become conductive. Moreover, this overcomes the risk of the metal layer short-circuiting pn junctions in the semiconductor chip.

In order to introduce blind holes or passage holes in the separating regions into the semiconductor wafer from the top side in the direction of the rear side, it is possible to use wet etching methods and dry etching methods. Dry etching methods, such as an RIE plasma etching, have the advantage of a directional removal from the wafer top side in the direction of the wafer rear side.

A further variant for arranging perforations in the separating regions of the semiconductor wafer is a laser removal. Said laser removal method has the advantage over wet etching and plasma etching that an etching mask does not have to be provided, since the laser can scan the surface at the corresponding perforation locations. The semiconductor wafer and in particular the walls of the perforations may be coated with an insulation layer by means of chemical molecular vapor phase deposition (MOCVD) or physical sputtering, for example a sputtering process, or by anodic deposition. In this case, oxidic insulation layers, such as silicon oxide, or ceramic oxide layers, such as boron nitride or silicon nitride, are applied to the walls of the perforation.

The application of a metal layer to the walls of the perforation may be effected by means of vapor deposition or sputtering or else by means of chemical deposition. This gives rise to metal layers having a thickness of between 0.5 and 5 µm, which can be thickened by electrodeposition or by application of soldering material. The application of solder material in the perforation holes may be effected by means of blade spreading of a liquid soldering composition from the top side of the semiconductor wafer to the passage holes in the separating regions, the perforations being completely filled with solder material. A further possibility for the application of solder material consists in distributing solder balls on the perforations and causing the solder to penetrate into the perforations in a fusion process, so that the perforation openings in the semiconductor wafer are filled with solder material.

After a process of filling the perforations in the semiconductor wafer, the latter may be sawn along the strip-type separating regions to form semiconductor chips or electronic components. Depending on whether the perforations have been completely filled with solder material or whether only a metal coating of the walls of the perforations has been effected, different edge contacts thus arise for each of the sawn-out semiconductor chips. The edge contacts filled with solder material have the advantage that they are connected directly and without additional solder among one another during the production of a semiconductor chip stack, or to a circuit substrate, which may have a BUS line, for example. In the latter case, semiconductor chips are fixed on the circuit substrate by one of their edge sides. In this case, the edge contacts of the semiconductor chip are connected to contact pads of the circuit substrate. When constructing a semiconductor stack, it is possible to orient the electronic semiconductor chips with their edge sides and edge contacts in such a way that, by means of a simple heating process, the solder materials form a continuous connection corresponding to a BUS line on a circuit substrate.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Figure 1:
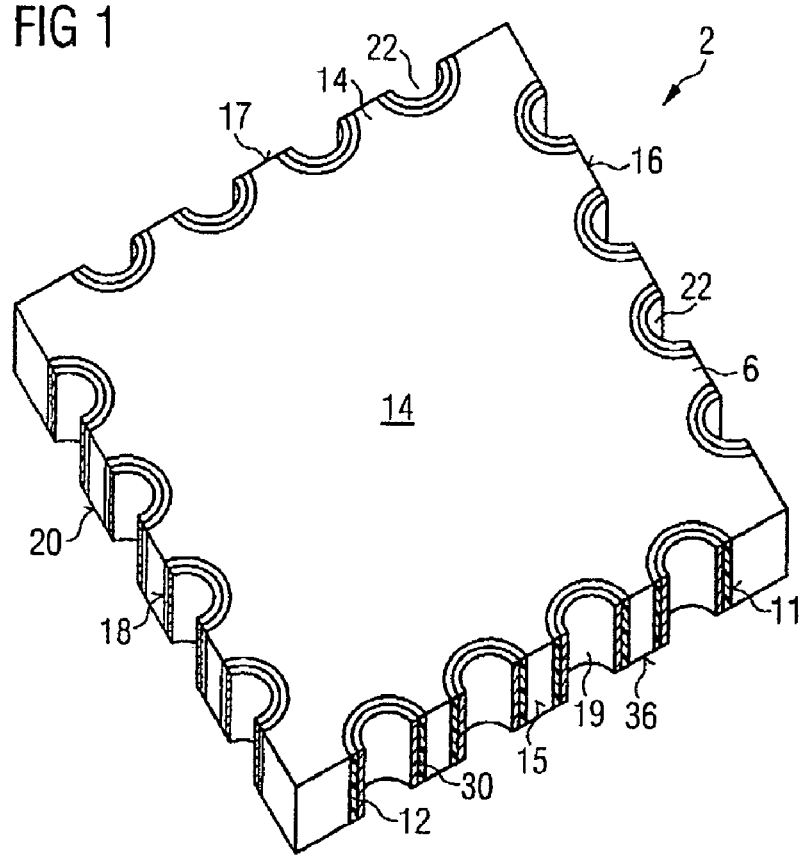
FIG. 1 illustrates a diagrammatic perspective view of an electronic component of a first embodiment of the invention.

FIG. 1 illustrates a diagrammatic perspective view of an electronic component 2 of a first embodiment of the invention. The electronic component 2 has the size of a semiconductor chip 6, the edge sides 15, 16, 17 and 18 of which have halved perforations. Said halved perforations extend at the edge sides 15, 16, 17 and 18 from a top side 14 of the semiconductor chip 6 to a rear side 36. The walls 11 of the perforations are covered with a layer sequence comprising an insulation layer 30 and a metal layer 12. The metal layer 12 forms edge contacts 19 at the edge sides 15, 16, 17 and 18. The underlying insulation layer 30 prevents short circuits and creepage currents between the edge contacts 19 via the semiconducting material of the semiconductor chip 6.

Such an electronic component 2 of semiconductor chip size has the advantage that it can be used in volume-saving fashion and diversely in electronic circuits. Thus, by way of example, it can be positioned perpendicularly on a circuit substrate. The edge contacts 19 of one of the edge sides 15, 16, 17 or 18 are then connected to the circuit substrate. A further possibility for such an electronic component 2 with edge side contacts 19 consists in positioning the electronic component 2 either with its top side 14 with respect to a circuit substrate or with its rear side 36 on a circuit substrate and connecting the edge side contacts 19 to corresponding contact pads of the circuit substrate. A further possibility of this electronic component 2 is for a plurality of components of the same type to be stacked one above the other and for the edge side contacts 19 of the stacked components to be interconnected.

Figure 2:
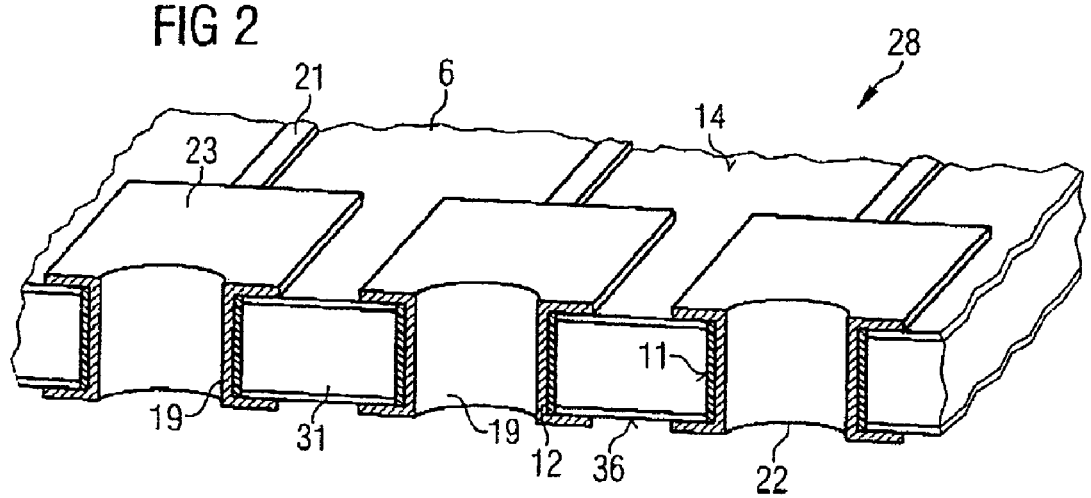
FIG. 2 illustrates a detail from an edge region of the electronic component in accordance with FIG. 1.

FIG. 2 illustrates a detail from an edge region 28 of the electronic component in accordance with FIG. 1. Contact areas 23 for the edge contacts 19 are provided on the top side 14 of the edge region 28, which merge with conductor tracks 21 of the semiconductor chip 6 on the top side 14. The semiconductor material 31 is completely surrounded by an insulation layer 30 made of silicon dioxide, silicon nitride or polyamide, thereby avoiding short circuits under the conductor tracks 21, the contact areas 23 or the edge contacts 19. The mutually insulated edge contacts 19 are applied to approximately semicylindrical cutouts 22 in the edge region 28 of the semiconductor chip 6 of this first embodiment of the invention.

Figure 3:
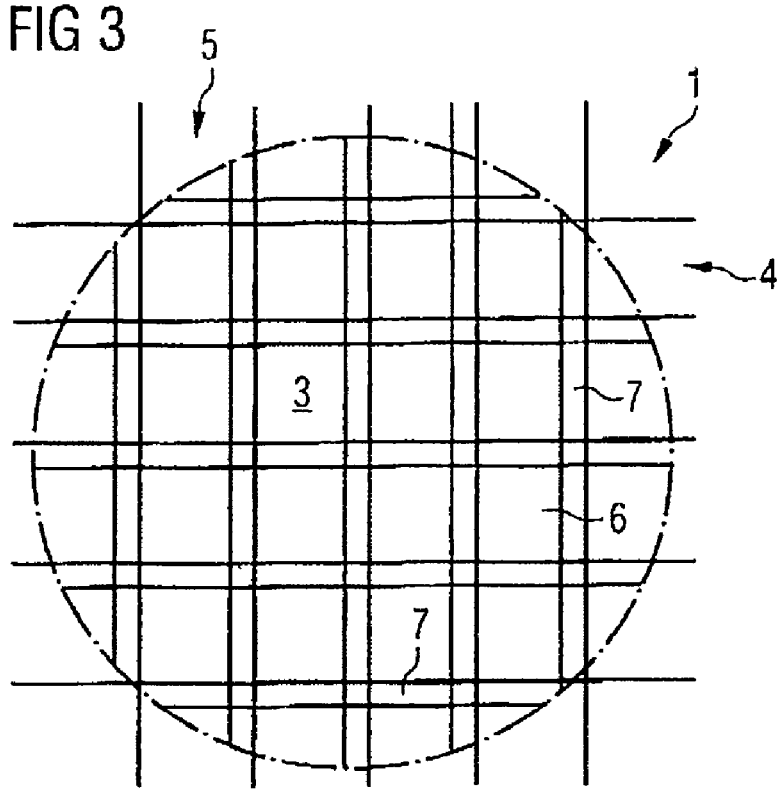
FIG. 3 illustrates a diagrammatic plan view of a semiconductor wafer with strip-type separating regions.

FIG. 3 illustrates a diagrammatic plan view of a semiconductor wafer 1 with strip-type separating regions 7. Said strip-type separating regions 7 form a grid pattern, in which case, between the strip-type separating regions 7, integrated circuits are arranged on the wafer top side 3 in rows 4 and columns 5. The strip-type separating regions 7 of the semiconductor wafer 1 are kept free from semiconductor components of the integrated circuits. Along said strip-type separating regions 7, such a semiconductor wafer 1 is separated into individual semiconductor chips 6 after the completion of the integrated circuits.

Figure 4:
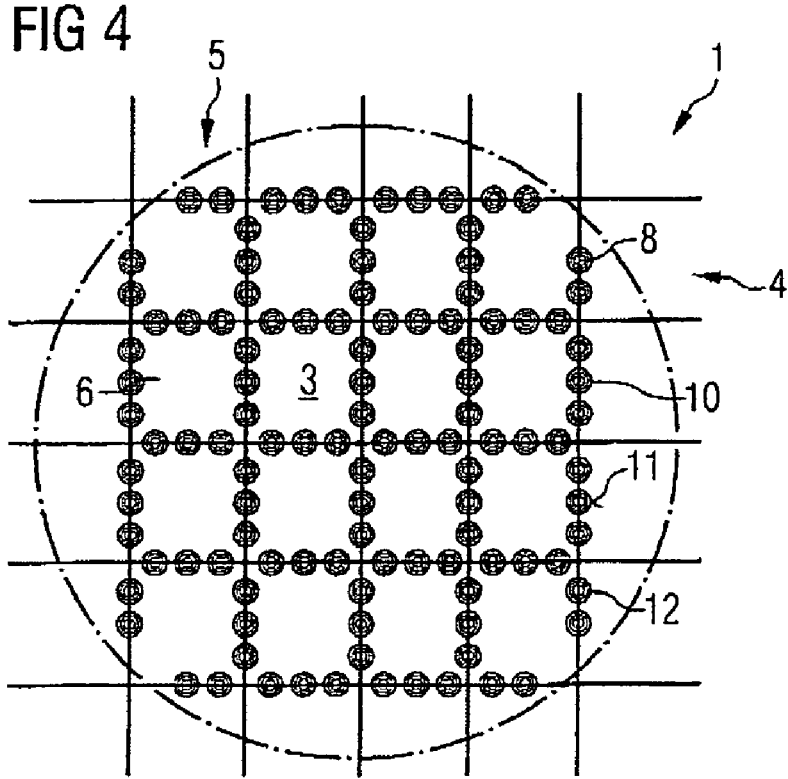
FIG. 4 illustrates a diagrammatic plan view of a semiconductor wafer in accordance with FIG. 3 with perforations along the separating regions.

FIG. 4 illustrates a diagrammatic plan view of a semiconductor wafer 1 in accordance with FIG. 3 with perforations 10 along the separating regions 7. Before the semiconductor wafer 1 is actually separated into individual semiconductor chips 6 by means of high-speed sawing, perforations 10 are introduced into the semiconductor wafer 1 along the strip-type separating regions 7, as can be seen in FIG. 4. Such perforations 10 are embodied in the form of blind holes or in the form of passage holes. Afterward, the walls 11 of the perforations are insulated, at least in the case of readily conductive semiconductor wafers, and then metalized, thereby producing the through contacts 8 which can be seen in FIG. 4. Furthermore, the metalized perforations 10, which are not yet completely filled in FIG. 4, may be filled with a metal, as can be seen in FIG. 5.

Figure 5:
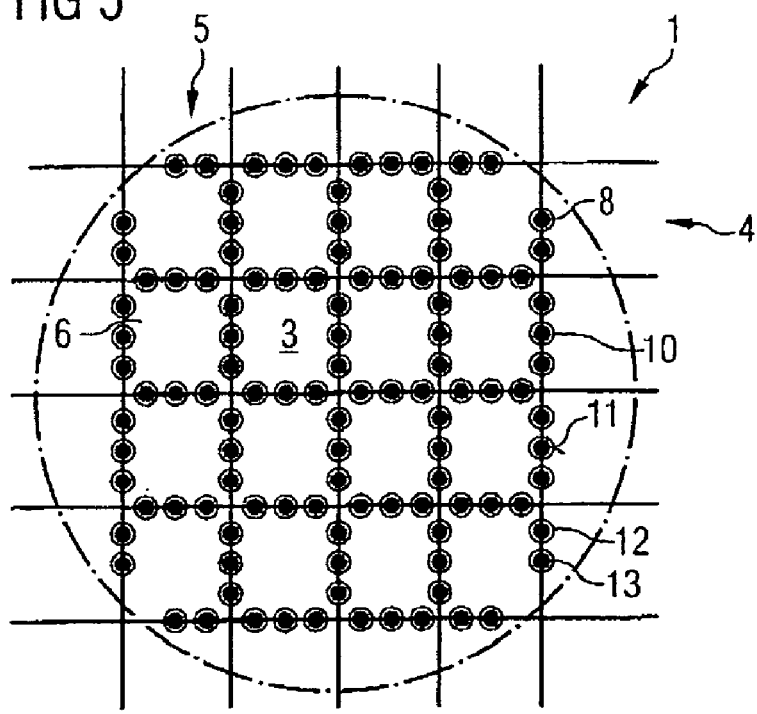
FIG. 5 illustrates a diagrammatic plan view of a semiconductor wafer in accordance with FIG. 3 with filled perforations along the separating regions.

FIG. 5 illustrates a diagrammatic plan view of a semiconductor wafer 1 in accordance with FIG. 3 with filled perforations 10 along the separating regions 7. In this case, the metalized perforations 10 shown in FIG. 4 have been filled with a fusible soldering tin. For this purpose, solder balls are positioned on each perforation opening and subsequently fill the perforation openings given a corresponding melting temperature.

Figure 6:
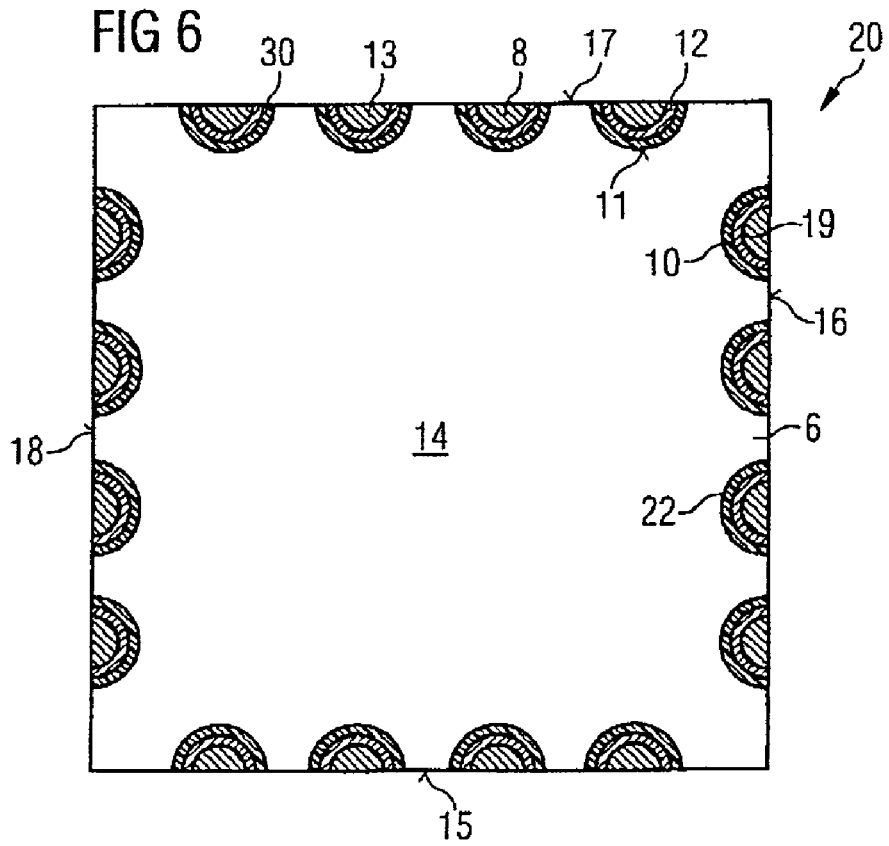
FIG. 6 illustrates a diagrammatic plan view of an electronic component of a second embodiment of the invention.

FIG. 6 illustrates a diagrammatic plan view of an electronic component 20 of a second embodiment of the invention. This electronic component 20 comprises a semiconductor chip 6 of a semiconductor wafer 1 shown in FIG. 5. The difference between the first embodiment in accordance with FIG. 1 of the electronic component 2 and the component 20 in FIG. 6 consists in the fact that the semicylindrical edge contacts 19 are completely filled with metal, the metal layer 12 being covered by a solder material 32.

Figure 7:
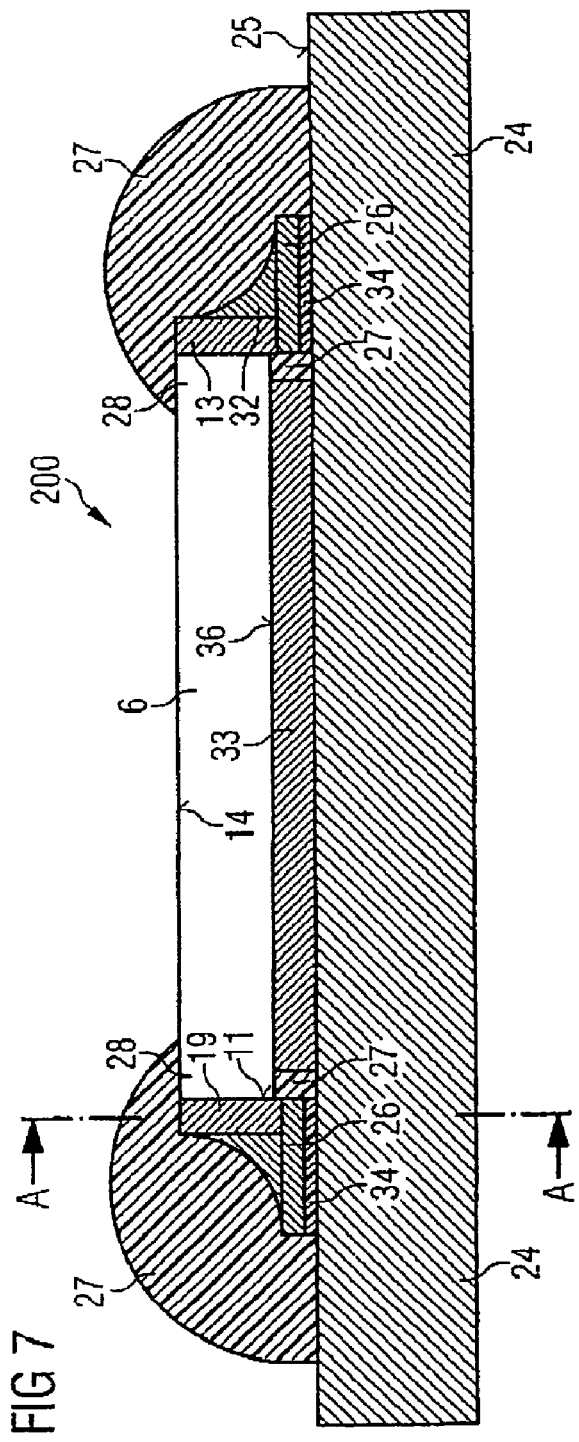
FIG. 7 illustrates a diagrammatic cross section through an electronic component of a third embodiment of the invention with a circuit substrate.

FIG. 7 illustrates a diagrammatic cross section through an electronic component 200 of a third embodiment of the invention with a circuit substrate 24. Said circuit substrate 24 protects the rear side of the semiconductor chip 6 and has external contacts (not shown here) of the electronic component 200. An integrated circuit on the top side 14 of the semiconductor chip 6 is connected via conductor tracks to the edge contacts 19, which are soldered on external contact areas 26, if the semiconductor chip 6 is embodied as an electronic component such as is illustrated in FIG. 6. For protection and for insulation of the edge contacts 19, the electronic component 200 has a plastics composition 27 for covering the edge regions 28 of the semiconductor chip 6.

If the circuit substrate 24 is constructed from a metal plate, then the rear side 36 of the semiconductor chip 6 is connected to the metallic circuit substrate 24 by means of an electrically conductive layer 33 made of soldering tin or conductive adhesive, which circuit substrate on the one hand serves as ground potential feed and on the other hand is arranged as a heat sink on the rear side 36 of the semiconductor chip 6. In order that the contact pads 26 on the metallic circuit substrate 24 are not short-circuited among one another, a patterned insulation layer 34 is arranged between contact pads 26 and the top side 25 of the metallic circuit substrate.

Figure 8:
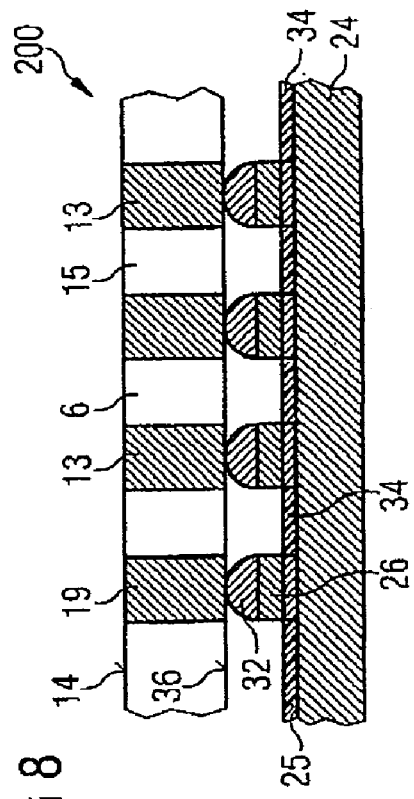
FIG. 8 illustrates a diagrammatic cross section of the electronic component in accordance with FIG. 7 along the section line A-A.

FIG. 8 illustrates a diagrammatic cross section of the electronic component 200 in accordance with FIG. 7 along the section line A-A before the connection of the semiconductor chip 6 and the edge contacts 19 thereof to contact pads 26 of the semiconductor substrate 24. Moreover, the plastics composition shown in FIG. 7 has not yet been applied to the edge regions of the semiconductor chip 6. The external contact areas 26 are covered with a solder material 32, which bonds with the solder material of the edge contacts 19 on fusion. During said fusion, the conductive layer 33 shown in FIG. 7 may simultaneously connect the semiconductor chip 6 to the metallic circuit substrate 24. The patterned insulation layer 34 ensures that no short circuit occurs between the contact pads 26 via the metallic circuit substrate 24.

If a nonmetallic insulating circuit substrate 24 is used instead of the metallic circuit substrate 24 shown here, then, on the one hand, the patterned insulation layer 34 is obviated and, on the other hand, a patterned metal layer (not shown here) on the insulating circuit substrate may connect the edge contacts 19 to corresponding external contacts (not shown here) of the electronic component 200 via the contact pads 26.

Figure 9:
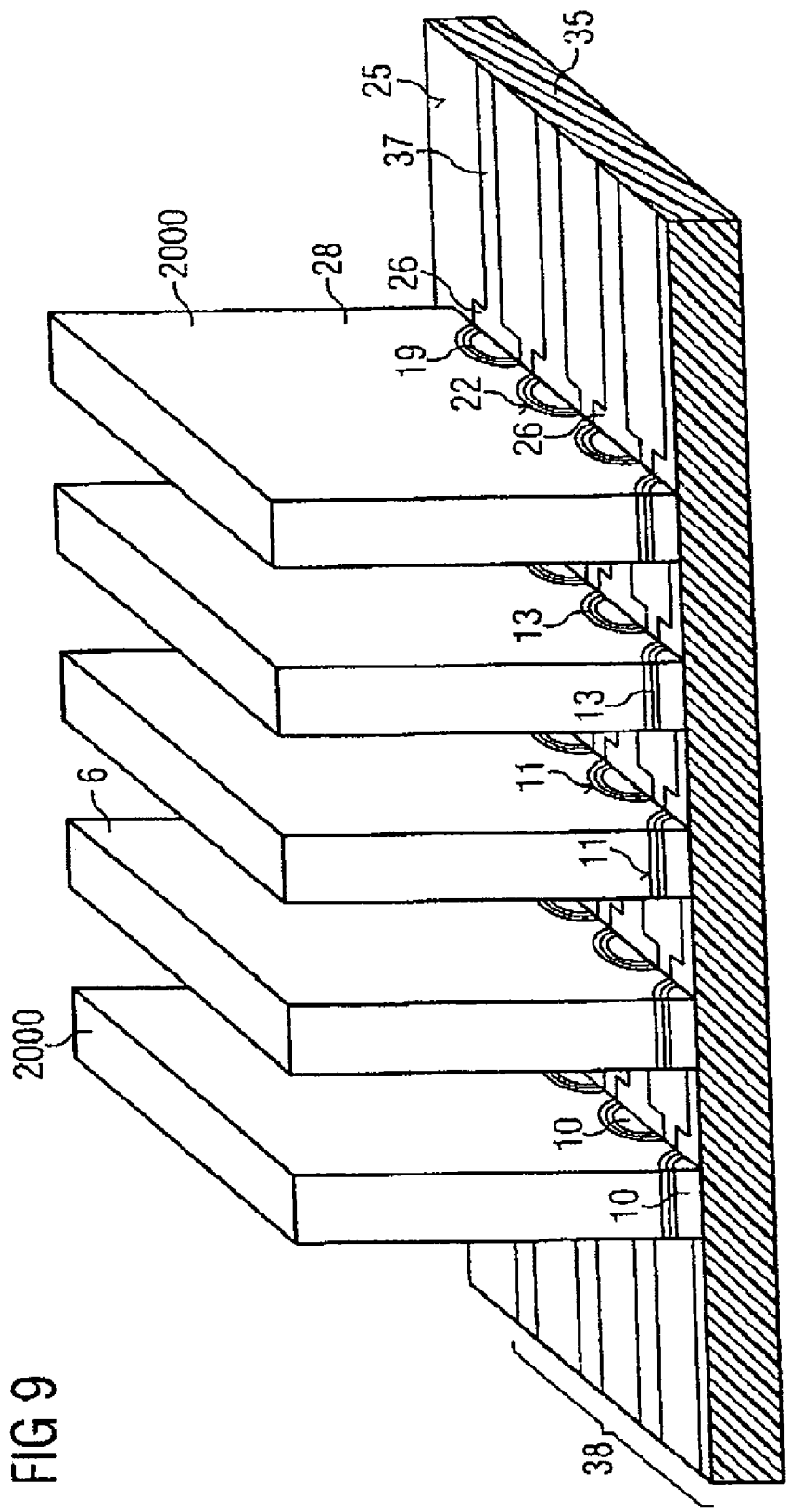
FIG. 9 illustrates a diagrammatic perspective view of a circuit substrate populated with a plurality of electronic components.

FIG. 9 illustrates a diagrammatic perspective view of an insulating circuit substrate 35 populated with a plurality of electronic components 2000. The insulating circuit substrate 35 has lines 37 running parallel on its top side 25, which lines form a BUS line to edge contacts 19 of the electronic components 2000.

In this fourth embodiment of the invention, the electronic components 2000 have edge contacts 19, filled with solder material 13, only in an edge region 28. Said edge region 28 is arranged on the top side 25 of the insulating circuit substrate 35, so that a multiplicity of memory components, in the fourth embodiment of the invention, can be connected in parallel via the BUS line 38 in a very confined space, an intensive cooling of top side and rear side of the electronic components 2000 of semiconductor chip size being possible between the components 2000. The insulating circuit substrate 35 may be a multilayer circuit film (not shown here) on which, even in the case of high flexibility, the electronic components 2000 of semiconductor chip size are securely fixed by their edge contacts 19. In addition to the bus line 38 as an address bus, control lines (not shown here) may be provided which drive individual electronic components 2000 on the insulating circuit substrate 35.

Figure 10:
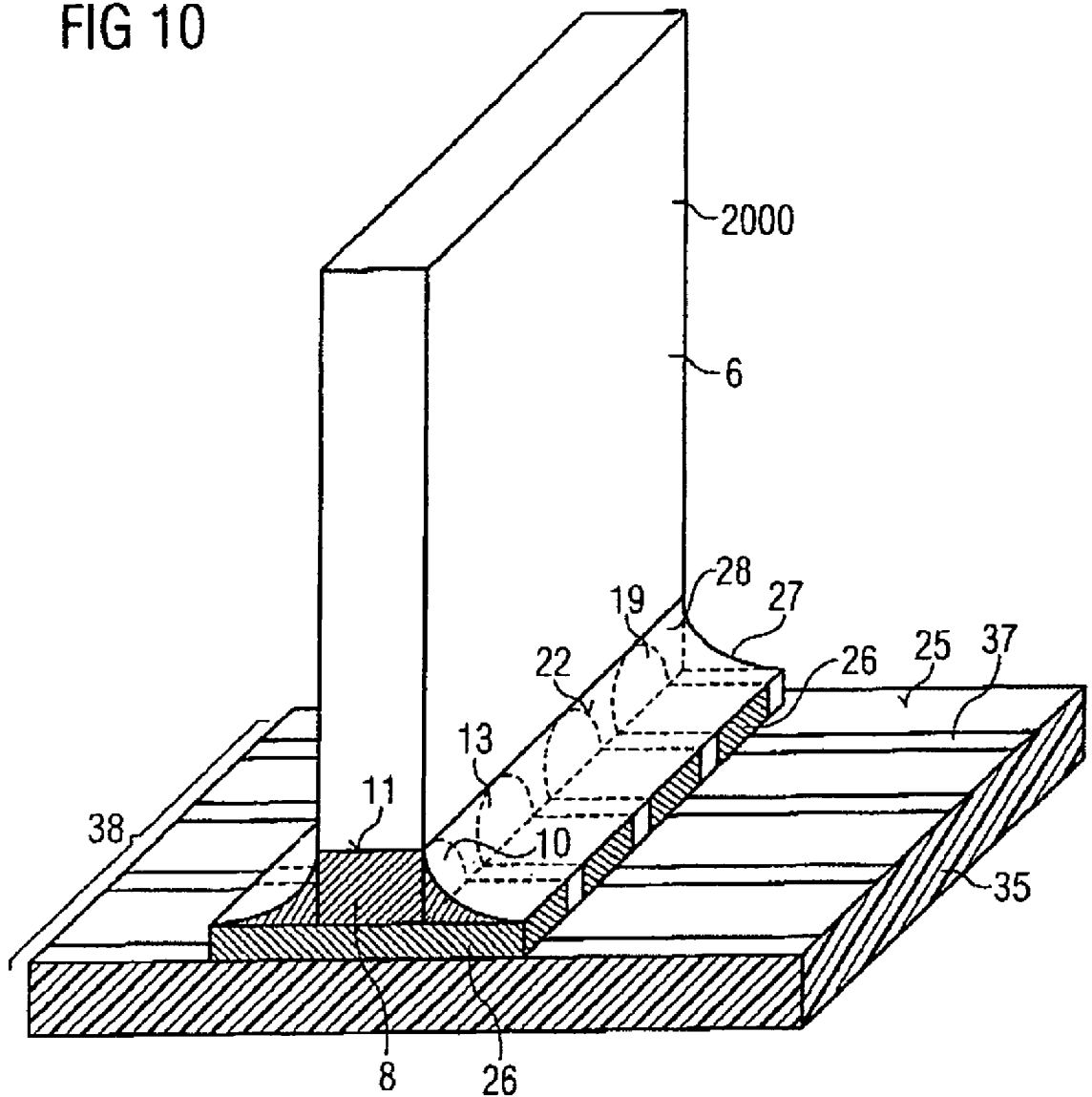
FIG. 10 illustrates a diagrammatic perspective view of an individual electronic component in accordance with FIG. 9.

FIG. 10 illustrates a diagrammatic perspective view of an individual electronic component 2000 in accordance with FIG. 9. The edge region 28 provided with edge contacts 19 is electrically protected by a plastics composition 27 and, at the same time, the orientation of the electronic component 2000 of semiconductor chip size is supported and fixed by the plastics composition 27 in the edge region 28 on the circuit substrate 35.

Figure 11:
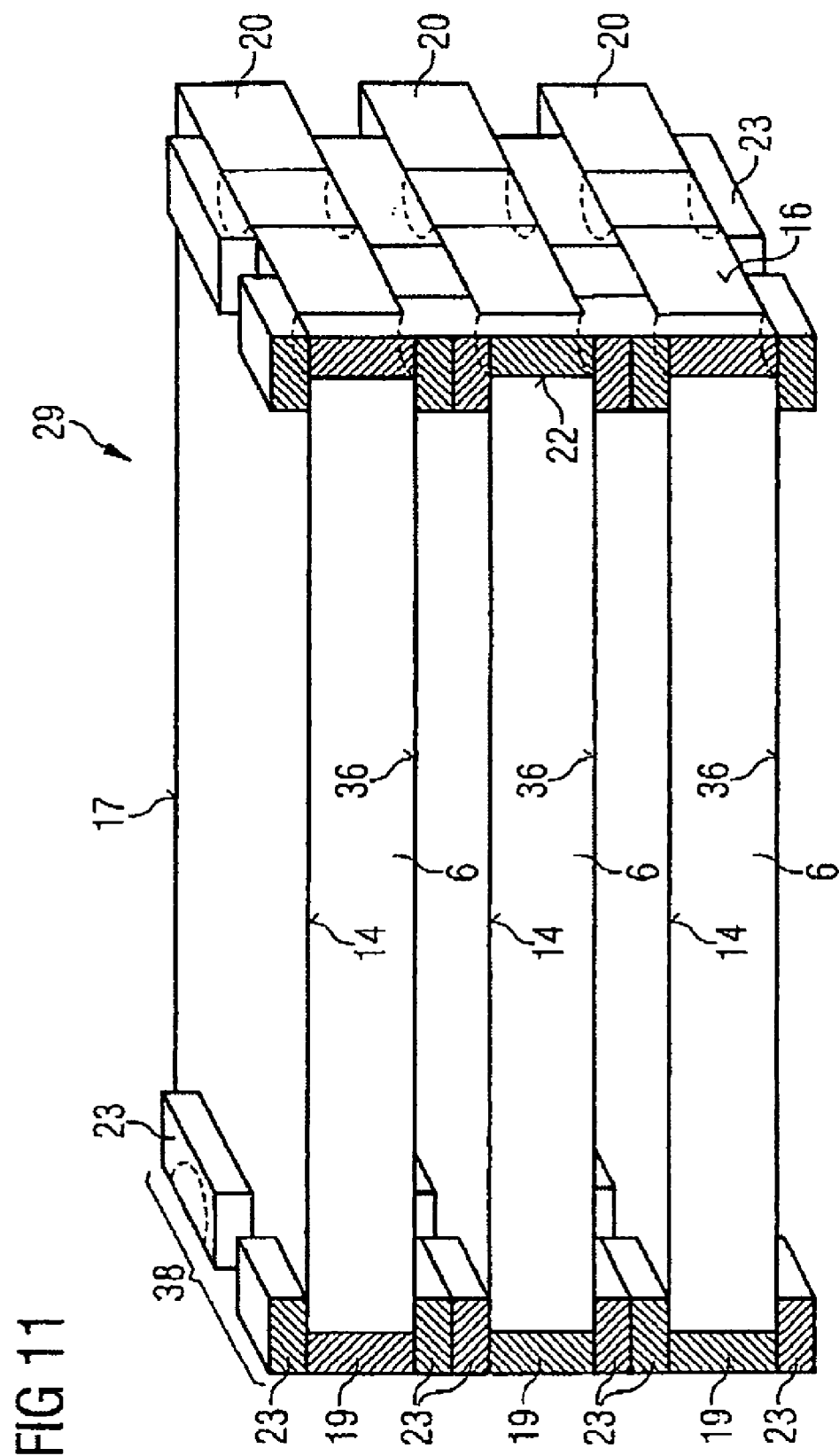
FIG. 11 illustrates a diagrammatic perspective view of a stack comprising electronic components in accordance with FIG. 6.

FIG. 11 illustrates a diagrammatic perspective view of a stack 29 comprising electronic components 20 in accordance with FIG. 6. The electronic components 20 have stacked semiconductor chips 6 without necessitating an additional rewiring plate or rewiring film between the stacked semiconductor chips 6, since the edge contacts 19 with their contact areas 23 are soldered together one under the other to form a parallel bus line. Such a stack 29 is the most compact possibility for stacking memory chips, in which case, except for a few edge contacts 19 for driving individual electronic components 20 in the stack 29, all the rest of the edge contacts 19 are through-connected completely from the lower up to the topmost electronic component 20.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor chip system, comprising:
   a plurality of semiconductor chips, each having:
   a top side, a rear side opposite and parallel to the top side, and edge sides;
   an integrated circuit on the top side;
   at least one edge side having edge contacts wherein the edge contacts extend from the top side in the direction of the rear side of the semiconductor chip;

wherein the edge contacts are connected to electrodes of the integrated circuit via conductor tracks located on the top surface of the semiconductor chip; and a circuit substrate having a top side with external contacts, wherein the semiconductor chips are electrically connected via the edge contacts among one another and wherein the semiconductor chips are electrically connected via the edge contacts to the external contacts on the circuit substrate such that the top and rear sides of the semiconductor chips are oriented virtually perpendicular to the top side of the circuit substrate.

2. The semiconductor chip system of claim 1, wherein the edge sides have a perforation-like structure, semicylinder-like cutouts extending as edge contacts from the top side in the direction of the rear side, and have a metal layer.

3. The semiconductor chip system of claim 2, wherein the edge sides also have an insulation layer.

4. The semiconductor chip system of claim 2, wherein the cutouts have a soldering material.

5. The semiconductor chip system of claim 2, wherein the edge contacts are extended on the top side to form a contact area and merge with a conductor track on the top side.

6. The semiconductor chip system of claim 2, wherein the semiconductor chips are arranged on the circuit substrate within an electronic component.

7. The semiconductor chip system of claim 6, wherein the external contacts on the top side of the circuit substrate is a conductor track structure having conductive lines running in parallel.

8. The semiconductor chip system of claim 7, wherein an insulating plastics composition is arranged on the circuit substrate in a manner embedding the edge sides of the semiconductor chip and the edge contacts.

9. The semiconductor chip system of claim 7, wherein the semiconductor chips are arranged with an edge side on the circuit substrate, the top side of the semiconductor chips being arranged in angular fashion with respect to the top side of the circuit substrate and the edge contacts being electrically connected to the external contacts.

* * * * *